(12) United States Patent
Sakoh et al.

(10) Patent No.: US 7,829,925 B2
(45) Date of Patent: Nov. 9, 2010

(54) SEMICONDUCTOR DEVICE AND METHOD FOR MANUFACTURING SAME

(75) Inventors: Takashi Sakoh, Kanagawa (JP); Mami Toda, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 410 days.

(21) Appl. No.: 11/834,090

(22) Filed: Aug. 6, 2007

(65) Prior Publication Data

US 2008/0048228 A1 Feb. 28, 2008

(30) Foreign Application Priority Data

Aug. 22, 2006 (JP) .............................. 2006-225892

(51) Int. Cl.
*H01L 27/108* (2006.01)
*H01L 29/94* (2006.01)
*H01L 21/8242* (2006.01)

(52) U.S. Cl. .............................. 257/296; 257/E27.097; 257/E21.646; 438/239

(58) Field of Classification Search ........................ None
See application file for complete search history.

(56) References Cited

U.S. PATENT DOCUMENTS

| | | | | |
|---|---|---|---|---|
| 5,994,762 | A * | 11/1999 | Suwanai et al. ............. | 257/620 |
| 6,562,679 | B2 * | 5/2003 | Lee et al. ..................... | 438/253 |
| 6,727,542 | B2 * | 4/2004 | Kim et al. .................... | 257/306 |
| 6,743,693 | B2 * | 6/2004 | Fujiishi ........................ | 438/386 |
| 6,870,265 | B2 * | 3/2005 | Kurimoto et al. ............ | 257/758 |
| 6,906,374 | B2 * | 6/2005 | Tanaka ......................... | 257/306 |
| 6,949,429 | B2 * | 9/2005 | Kim et al. .................... | 438/253 |
| 7,132,720 | B2 * | 11/2006 | Yoshizawa et al. ........... | 257/409 |
| 2004/0173831 | A1 * | 9/2004 | Kim et al. .................... | 257/296 |
| 2007/0001307 | A1 * | 1/2007 | Usui et al. .................... | 257/758 |
| 2007/0085172 | A1 * | 4/2007 | Hsu .............................. | 257/659 |
| 2008/0122039 | A1 * | 5/2008 | Liu ............................... | 257/620 |

FOREIGN PATENT DOCUMENTS

| | | | |
|---|---|---|---|
| JP | 2002-134506 | * | 5/2002 |
| JP | 2005-167198 | * | 6/2005 |
| JP | 2005-167198 | A | 6/2005 |
| JP | 2006-147668 | * | 6/2006 |
| JP | 2006-147668 | A | 6/2006 |

* cited by examiner

*Primary Examiner*—Andy Huynh
*Assistant Examiner*—Hoang-Quan T Ho
(74) *Attorney, Agent, or Firm*—Sughrue Mion, PLLC

(57) ABSTRACT

In a conventional semiconductor device, an excessive etching occurs in a section where an opening for contact plug is formed, causing a damage to a diffusion layer located under the opening.

A semiconductor device 1 includes a region D1 for forming an electric circuit, and a seal ring 30 (guard ring) that surrounds the region D1 for forming the electric circuit. A DRAM 40 is formed in the region D1 for forming the electric circuit. Interlayer insulating films 22, 24, 26 and 28 are formed on a semiconductor substrate 10. The seal ring 30 is formed in the interlayer insulating films 22, 24, 26 and 28, and at least a portion there of is located spaced apart from the semiconductor substrate 10.

16 Claims, 20 Drawing Sheets

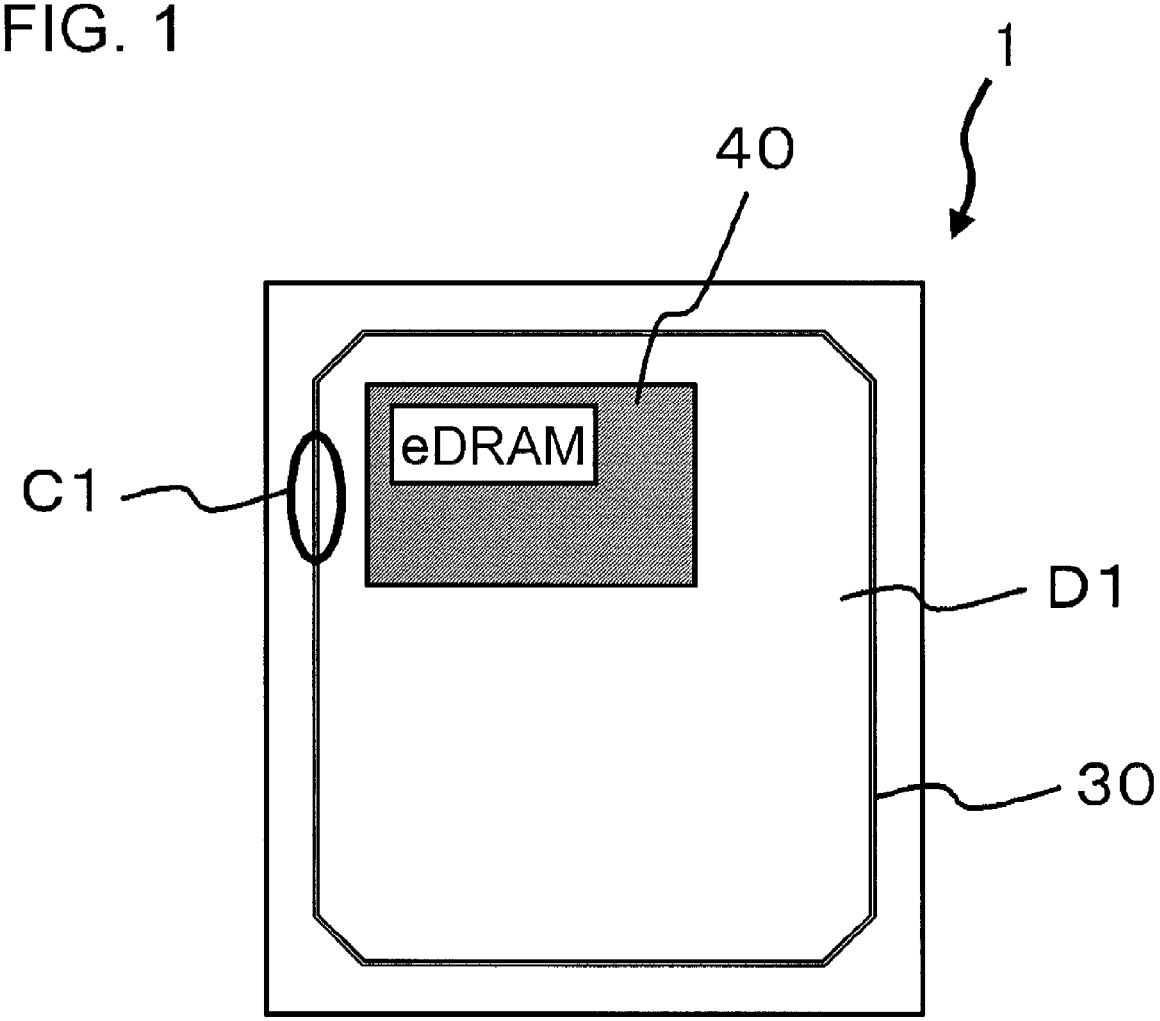

SEMICONDUCTOR DEVICE AND METHOD FOR MANUFACTURING SAME

This application is based on Japanese patent application No. 2006-225,892, the content of which is incorporated hereinto by reference.

BACKGROUND

1. Technical Field

The present invention relates to a semiconductor device and a method for manufacturing thereof.

2. Related Art

Japanese Patent Laid-Open No. 2005-167,198 discloses a semiconductor device, which is provided with a seal ring. The seal ring is composed of a plurality of stacked electroconducting plugs. These electroconducting plugs are formed simultaneously with forming the contact plug in a region for forming an electric circuit. Further, these electroconducting plugs are so-called trench contacts, and continually surrounding a region for forming an electric circuit. Such seal ring allows inhibiting a water influx into the region for forming the electric circuit from the exterior thereof.

Other prior art literatures related to the present invention includes Japanese Patent Laid-Open No. 2006-147,668, in addition to the aforementioned Japanese Patent Laid-Open No. 2005-167,198.

Nevertheless, in a case of employing a seal ring that continually surrounds a region for forming an electric circuit, a space of an opening constituting an electroconducting plug is considerably larger than a space of an opening for forming a contact plug. Therefore, concerning an etch rate for forming both openings by etch processes, an etch rate for the opening for the above-described electroconducting plug is lower than an etch rate for the opening for the contact plug. Therefore, an excessive etching occurs in a section where the opening for contact plug is formed, causing a damage to a diffusion layer located under the opening. When a dynamic random access memory (DRAM) is provided in the region for forming electric circuits, a damage in the diffusion layer induces an increased cell leakage current, deteriorating data-storing ability of the DRAM.

SUMMARY

According to one aspect of the present invention, there is provided a semiconductor device having a region for forming an electric circuit provided with a dynamic random access memory (DRAM), comprising: a semiconductor substrate; an interlayer insulating film provided on the semiconductor substrate; and a guard ring, provided in the interlayer insulating film, and surrounding the region for forming the electric circuit, wherein at least a portion of the guard ring is spaced apart from the semiconductor substrate.

In such semiconductor device, a portion of or the whole of the guard ring is located spaced apart from the semiconductor substrate. This allows avoiding the above-described problem, that is, the problem of an excessive etching or over-etching resulted from having a considerably larger size of the opening for the guard ring as compared with the opening for the contact plug. Consequently, a damage brought to the diffusion layer located under the contact plug can be reduced, thereby reducing a deterioration in the data-storing ability of the DRAM.

According to the present invention, the semiconductor device including the DRAM having better data-storing ability and method for manufacturing thereof are achieved.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 1 is a plan view, illustrating first embodiment of a semiconductor device according to the present invention;

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable exemplary implementations of semiconductor devices and methods for manufacturing semiconductor devices according to the present invention will be described in reference to the annexed figures. In all figures, identical numeral is assigned to an element commonly appeared in the description of the present invention in reference to the figures, and the detailed description thereof will not be repeated.

First Embodiment

FIG. 1 is a plan view, illustrating first embodiment of a semiconductor device according to the present invention. A semiconductor device 1 includes a region D1 for forming an electric circuit and a seal ring 30 (guard ring) that surrounds the region D1 for forming the electric circuit. A DRAM 40 is formed in the region D1 for forming the electric circuit. Logic circuits including peripheral circuits of the DRAM 40 are formed in sections of the region D1 for forming the electric circuit except the DRAM 40. In other words, the DRAM 40 is an embedded DRAM.

Figure 2A:
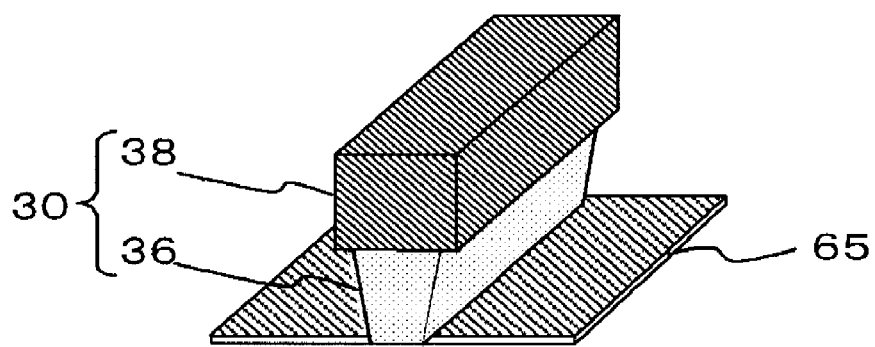
FIG. 2A is a perspective view, illustrating a seal ring of the semiconductor device of FIG. 1, and FIGS. 2B and 2C are cross-sectional views, illustrating a DRAM unit and a logic unit of the semiconductor device, respectively.
Figure 2B:
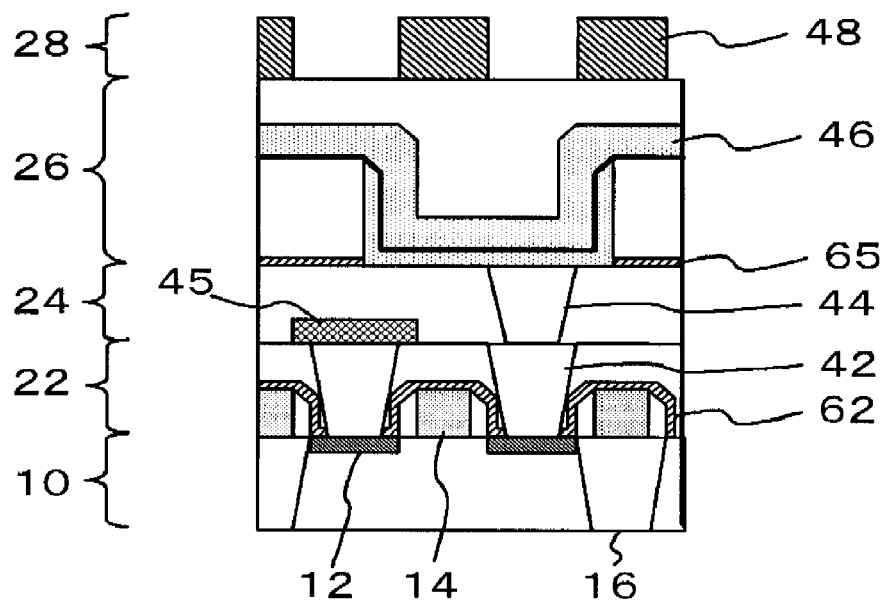
Figure 2C:
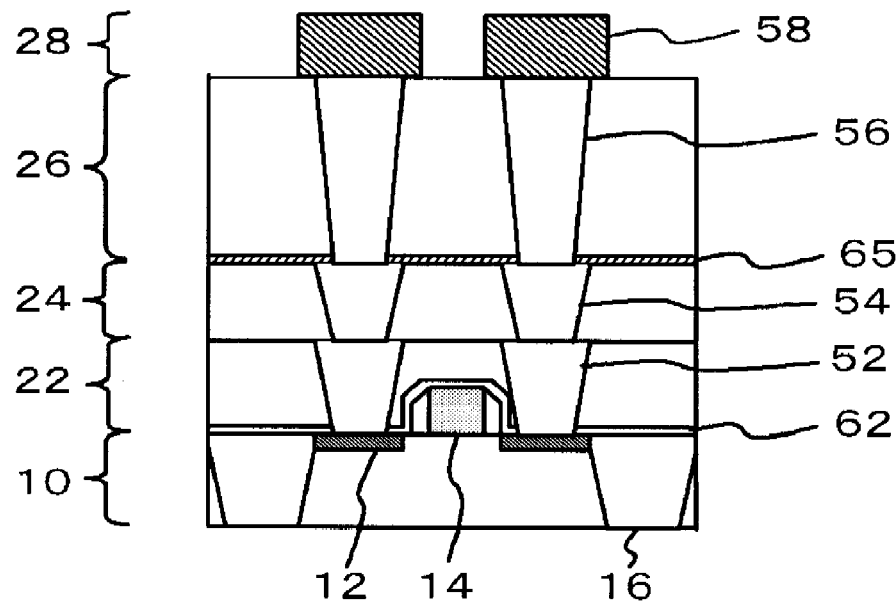

FIG. 2A is a perspective view, illustrating a portion of the seal ring 30 (a section surrounded by an ellipse C1 of FIG. 1). FIG. 2B and FIG. 2C are cross-sectional views, illustrating a portion of the DRAM 40 and a portion of a logic circuit, respectively. An interlayer insulating film 22 (first interlayer insulating film), an interlayer insulating film 24, an interlayer insulating film 26 (second interlayer insulating film) and an interlayer insulating film 28 are sequentially deposited on a semiconductor substrate 10. The semiconductor substrate 10 is composed of, for example, a silicon substrate. The interlayer insulating films 22, 24, 26 and 28 are composed of, for example, silicon dioxide ($SiO_2$) films. It is not necessary that all the interlayer insulating films 22, 24, 26 and 28 are composed of the same material. For example, the interlayer insulating films 22, 24 and 26 may be composed of $SiO_2$ films, and the interlayer insulating film 28 may be composed of a low dielectric constant film (low-K film).

A nitride film 65 is provided between the interlayer insulating film 24 and the interlayer insulating film 26 so as to contact with the lower surface of the interlayer insulating film 26. Typical material available for composing the nitride film 65 may include a silicon oxynitride (SiON) film, a silicon carbonitride (SiCN) film, a silicon nitride (SiN) film and the like.

Though it is not shown in FIG. 2A, the semiconductor substrate 10 and the interlayer insulating films 22, 24, 26 and 28 are also provided in a section of the seal ring 30. The seal rings 30 are formed in the interlayer insulating films 22, 24, 26 and 28. More specifically, the seal rings 30 are formed only in the interlayer insulating films 26 and 28, and no seal ring is formed in the interlayer insulating films 22 and 24. This provides the configuration, in which the whole seal ring 30 is spaced apart from the semiconductor substrate 10. A portion of the seal ring 30 formed in the interlayer insulating film 26 is composed of trench contacts, which is, in other words, trench-shaped electroconducting plugs 36 continually surrounding the region D1 for forming the electric circuit. Further, another portion of the seal ring 30 formed in interlayer insulating film 28 is composed of copper (Cu) interconnects 38.

As shown in FIG. 2B and FIG. 2C, the portion of the semiconductor substrate 10 in the region D1 for forming the electric circuit is provided with a field effect transistor (FET) having a diffusion layer 12 functioning as a source-drain region and a gate electrode 14. Each of such FETs is isolated with other elements by an element isolation region 16 formed in semiconductor substrate 10 such as shallow trench isolation (STI). Further, a SiN film 62 (direct nitride film) is formed in the interlayer insulating film 22, and the above-described FET is coated with such SiN film 62.

As shown in FIG. 2B, in sections of the DRAM 40 in the region D1 for forming the electric circuit, a contact plug 42, a contact plug 44 and a Cu interconnect 48 are formed in the interlayer insulating film 22, in the interlayer insulating film 24 and in the interlayer insulating film 28, respectively. A capacitor 46 is formed in the interlayer insulating film 26. The capacitor 46 is electrically coupled to a source-drain region (diffusion layer 12) of the FET through the contact plugs 42 and 44. The capacitor 46 and the FET constitutes cells of the DRAM 40. Further, tungsten (W) interconnects 45 constituting bit lines of the DRAM 40 are also formed in the interlayer insulating film 24. As such, the DRAM 40 in the present embodiment has a capacitor over bit-line (COB) structure.

As shown in FIG. 2C, in a portion of logic circuit of the region D1 for forming the electric circuit, contact plugs 52, 54 and 56 are formed in the interlayer insulating films 22, 24 and 26, respectively. These contact plugs 52, 54 and 56 form a type of a stacked contact, and these contact plugs are subsequently stacked. Cu interconnects 58 are formed in the interlayer insulating film 28.

Figure 3A:
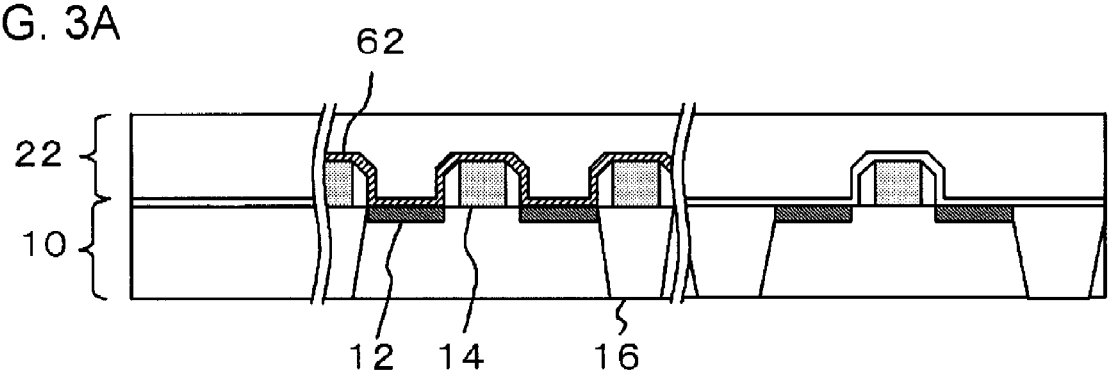
FIGS. 3A and 3B are cross-sectional views, illustrating an example of a process for manufacturing the semiconductor device of FIG. 1.
Figure 3B:
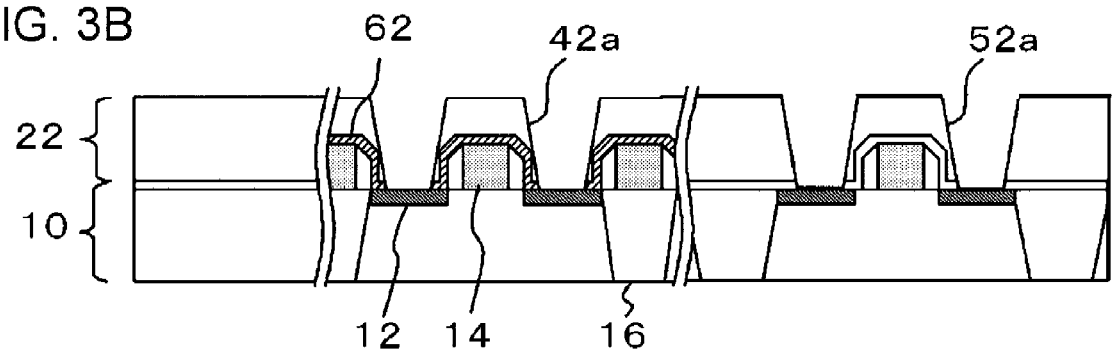

An example of a method for manufacturing the semiconductor device 1 will be described as an exemplary implementation of a method for manufacturing the semiconductor device according to the present invention, in reference to FIG. 3 to FIG. 8. A section of the seal ring 30, a section of the DRAM 40 and a section of the logic circuit are shown in left side, middle and right side in each of the diagrams, respectively. First of all, the diffusion layer 12, the gate electrode 14 and the element isolation region 16 on the semiconductor substrate 10, and then, the SiN film 62 is formed on the entire surface thereof. Further, the interlayer insulating film 22 is formed so as to cover these layers (FIG. 3A). Subsequently, the openings 42a and 52a for the contact plugs are formed in the interlayer insulating film 22 (FIG. 3B).

Figure 4A:
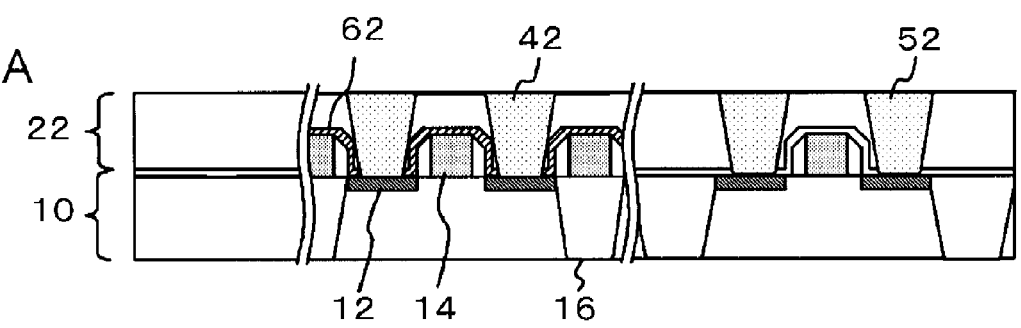
FIGS. 4A and 4B are cross-sectional views, illustrating an example of the process for manufacturing the semiconductor device of FIG. 1.
Figure 4B:
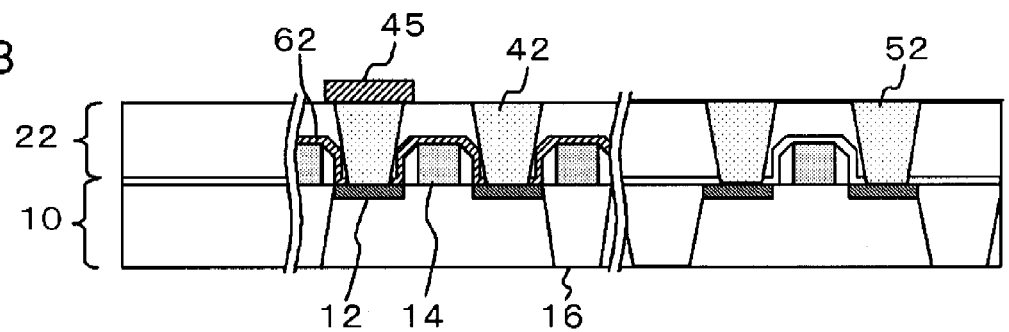

Next, the openings 42a and 52a are plugged with a conductive material to form the contact plugs 42 and 52. For example, a titanium (Ti) film having a thickness of about 20 nm, a titanium nitride (TiN) film having a thickness of about 40 nm and a tungsten (W) film having a thickness of about 300 nm may be sequentially deposited, and then, a chemical mechanical polishing (CMP) process may be performed to provide a preferable formation of the contact plugs 42 and 52 (FIG. 4A). Subsequently, a W interconnect 45 is formed on the interlayer insulating film 22. For example, a TiN film having a thickness of about 20 nm and a W film having a thickness of about 50 nm are sequentially deposited, and then, a patterning is performed, so that the W interconnect 45 can be preferably formed (FIG. 4B).

Figure 5A:
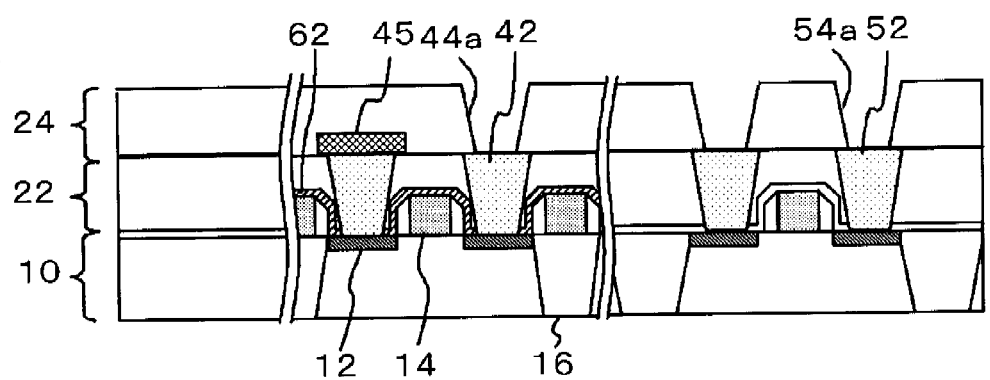
FIGS. 5A and 5B are cross-sectional views, illustrating an example of the process for manufacturing the semiconductor device of FIG. 1.
Figure 5B:
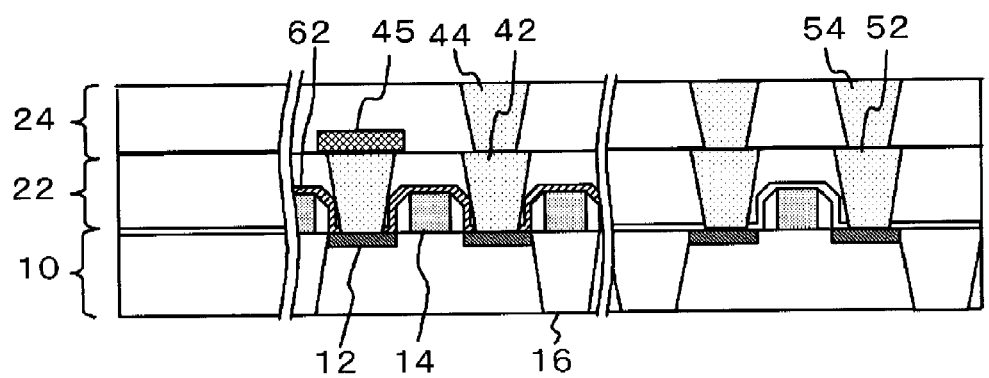

Next, the interlayer insulating film 24 is formed on interlayer the insulating film 22 so as to cover the W interconnect 45. Thereafter, openings 44a and 54a for contact plugs are formed in the interlayer insulating film 24 (FIG. 5A). Subsequently, the openings 44a and 54a are plugged with a conductive material to form contact plugs 44 and 54. For example, a TiN film having a film thickness of about 20 nm and a W film having a film thickness of about 300 nm are sequentially deposited, and then a CMP process is performed to provide a preferable formation of the contact plugs 44 and 54 (FIG. 5B).

Figure 6A:
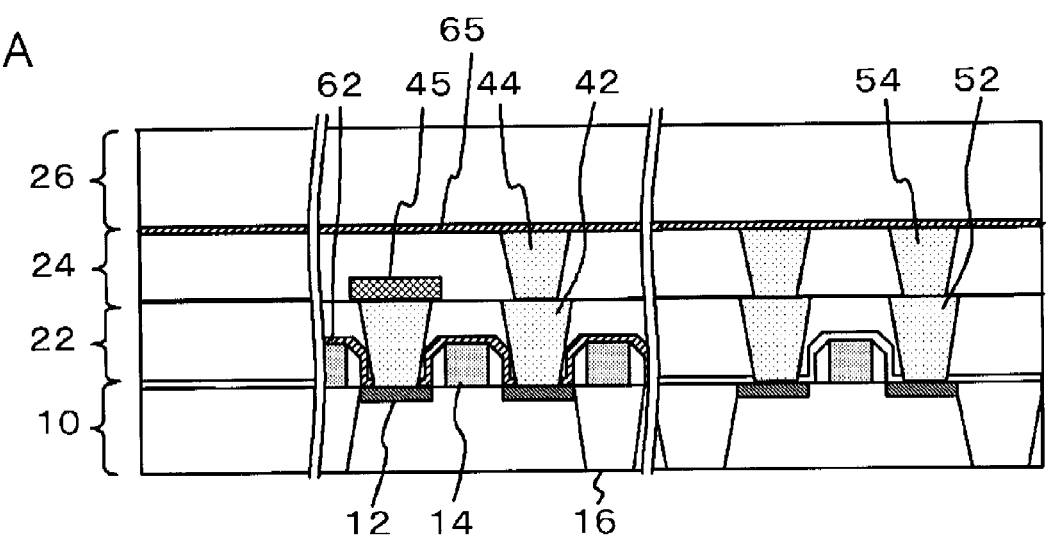
FIGS. 6A and 6B are cross-sectional views, illustrating an example of the process for manufacturing the semiconductor device of FIG. 1.
Figure 6B:
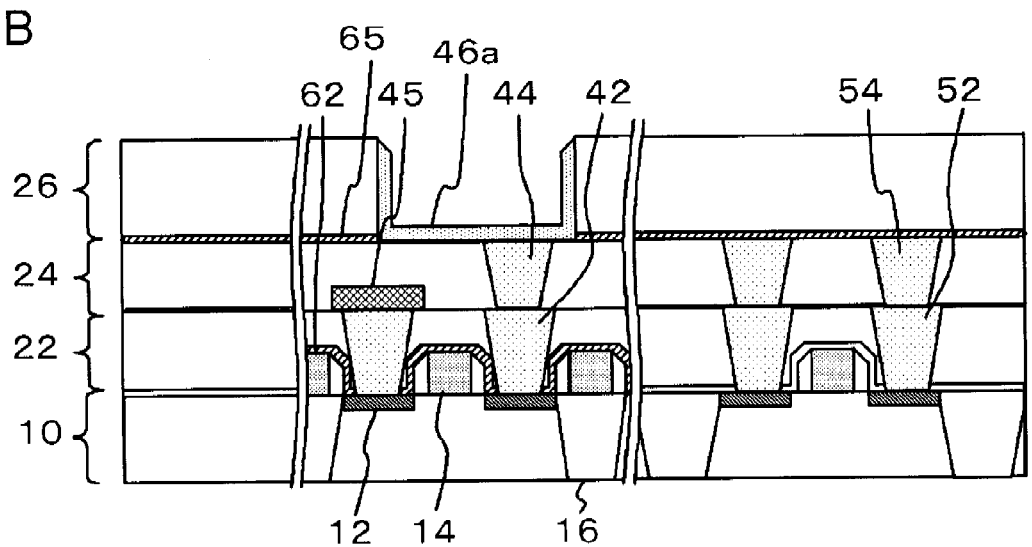

Next, a SiON film having a thickness of, for example, about 50 nm, serving as the nitride film 65, is deposited on the entire surface of interlayer insulating film 24. Thereafter, a portion of the interlayer insulating film 26 is formed on the nitride film 65. The thickness of the interlayer insulating film 26 formed here is, for example, about 400 nm (FIG. 6A). Subsequently, an opening for capacitor is formed by utilizing the nitride film 65 as an etch stop, and then a lower electrode 46a is formed in the inside thereof. For example, a TiN film having a thickness of about 20 nm is deposited, and then, portions of the deposited TiN film except portions corresponding to the above-described openings are removed to preferably form the lower electrode 46a (FIG. 6B).

Figure 7A:
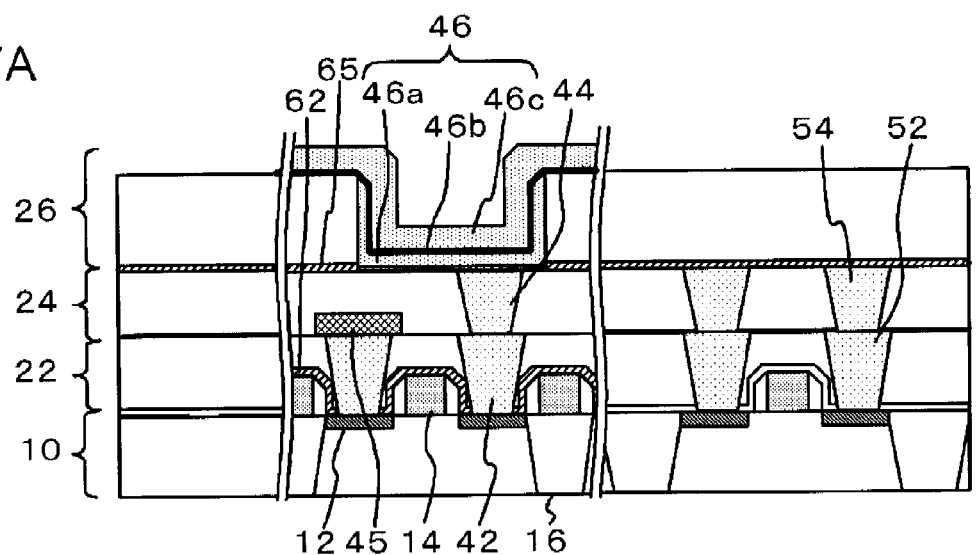
FIGS. 7A and 7B are cross-sectional views, illustrating an example of the process for manufacturing the semiconductor device of FIG. 1.
Figure 7B:
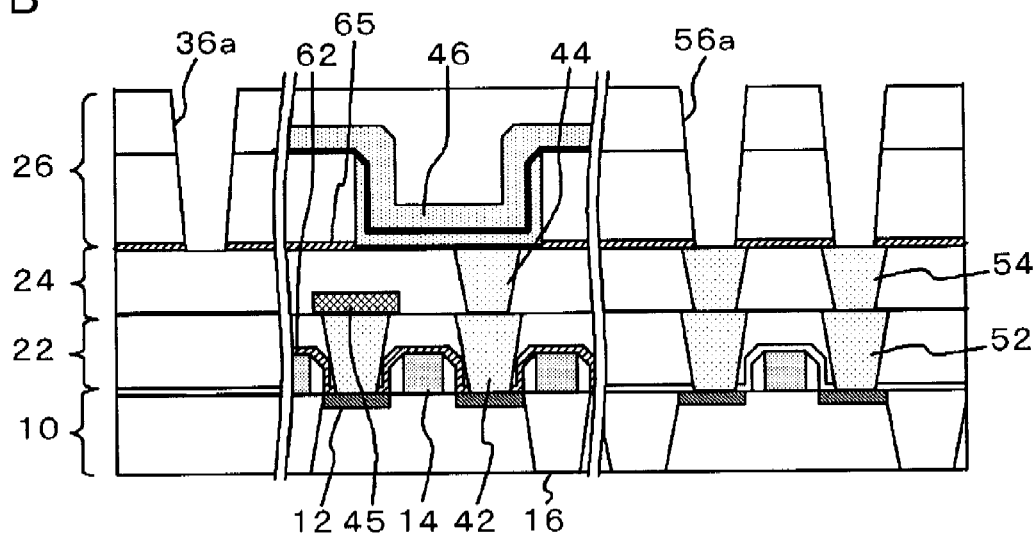

Next, for example, a zirconium dioxide ($ZrO_2$) having a thickness of about 10 nm, serving as a capacitance insulating film 46b, is deposited. Thereafter, an upper electrode 46c is formed on the capacitance insulating film 46b. For example, a titanium nitride film having a thickness of about 30 nm and a W film having a thickness of about 100 nm are sequentially deposited, and then, a patterning is performed, so that the upper electrode 46c can be preferably formed (FIG. 4B). Subsequently, the rest of the sections of the interlayer insulating film 26 is formed, and then, openings 36a and 56 for contact plugs are formed in the interlayer insulating film 26 (FIG. 7B). In such configuration, the opening 36a formed in the section of the seal ring 30 is a trench-shaped opening surrounding the region D1 for forming the electric circuit.

Figure 8A:
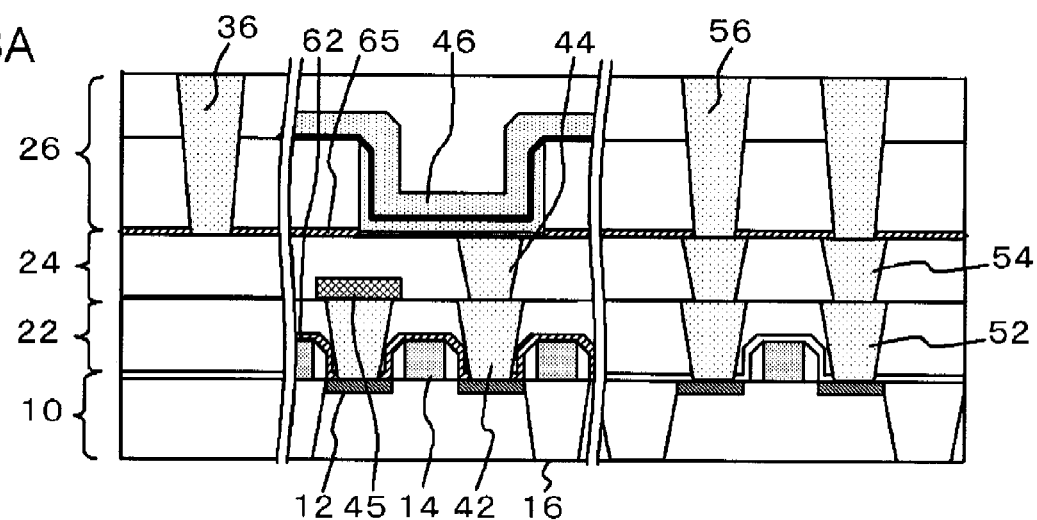
FIGS. 8A and 8B are cross-sectional views, illustrating an example of the process for manufacturing the semiconductor device of FIG. 1.
Figure 8B:
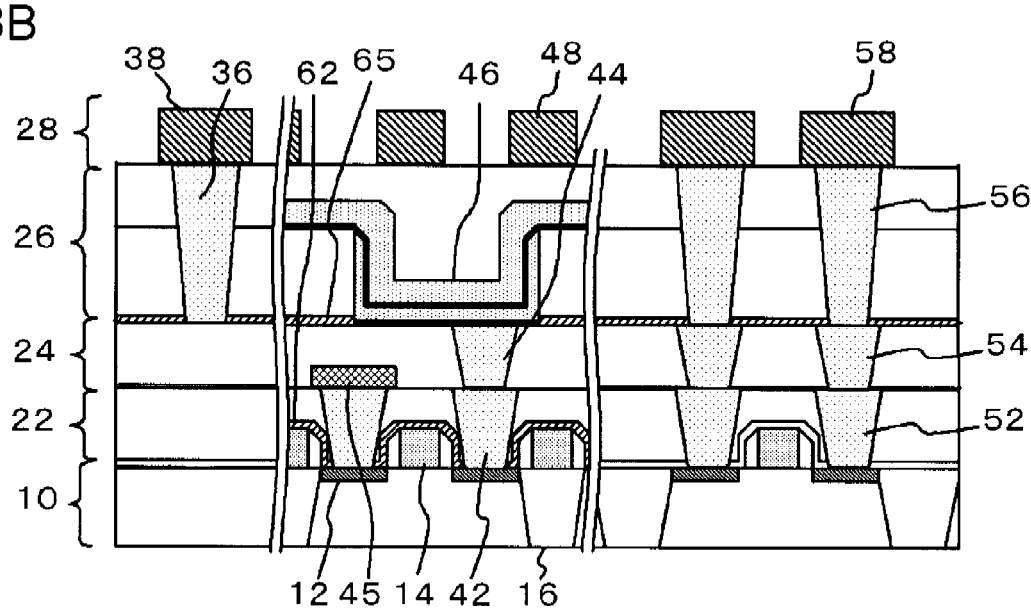

Next, the openings 36a and 56a are plugged with a conductive material to form the electroconducting plug 36 and the contact plug 56. For example, a TiN film having a film thickness of about 20 nm and a W film having a film thickness of about 300 nm are sequentially deposited, and then a CMP process is performed to provide a preferable formation of form the electroconducting plug 36 and the contact plug 56 (FIG. 8A). Subsequently, the interlayer insulating film 28 and the Cu interconnects 38, 48 and 58 are formed on the interlayer insulating film 26 (FIG. 8B). According to the above-described process, the semiconductor device 1 is obtained.

While the single layer Cu interconnect is shown in the present embodiment, the Cu interconnects may be provided in a plurality of layers. In such case, the via plugs and other Cu interconnects may be alternately stacked on the Cu interconnect 38, 48 and 58.

Advantageous effects obtainable by employing the configuration of the present embodiment will be described. In the present embodiment, the whole of the seal ring 30 is spaced apart from the semiconductor substrate. This can avoid a need for simultaneously forming the opening for seal ring 30 with forming the opening 42a for contact plug (see FIG. 3B), so that the etch process can be performed with an optimum condition for forming the opening 42a. Consequently, a damage brought to the diffusion layer 12 located under the opening 42a due to the over-etching can be reduced, thereby reducing a deterioration in the data-storing ability of the DRAM 40. Thus, the semiconductor device 1 including the DRAM 40 having better data-storing ability and the method for manufacturing such device are achieved. While a deterioration of the data-storing ability of DRAM causes an issue of a decrease in the production yield of the semiconductor devices, the configuration of the present embodiment can avoid such issue.

Further, the nitride film 65 is provided on the lower surface of the interlayer insulating film 26. Such nitride film 65 can effectively prevent water from entering to the interconnects in the region D1 for forming the electric circuit. Further, the SiN film 62 is provided so as to cover the FET formed in the region D1 for forming the electric circuit. Such SiN film 62 can effectively prevent water from entering the FET.

Second Embodiment

Figure 9A:
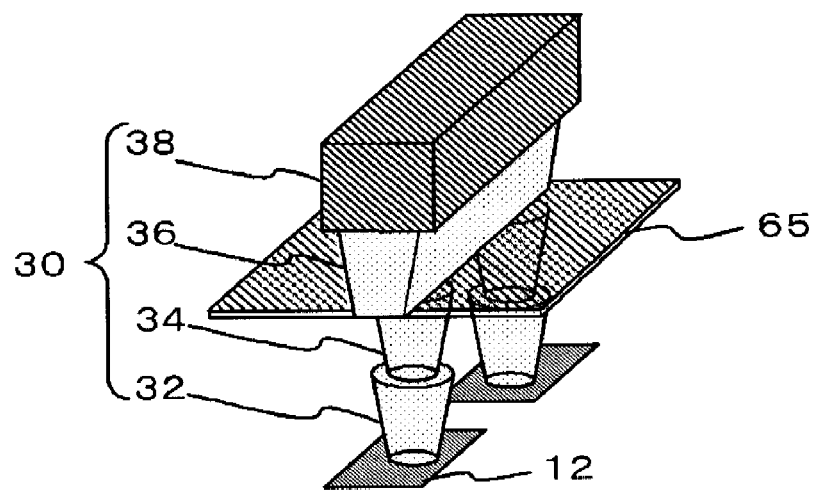
FIG. 9A is a perspective view, illustrating a seal ring of the semiconductor device according to second embodiment.
Figure 9B:
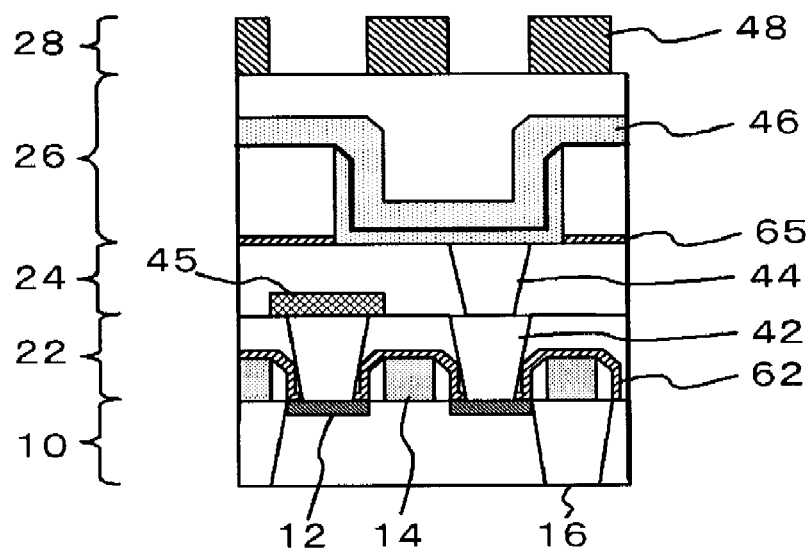
FIGS. 9B and 9C are cross-sectional views, illustrating a DRAM unit and a logic unit of the semiconductor device, respectively.
Figure 9C:
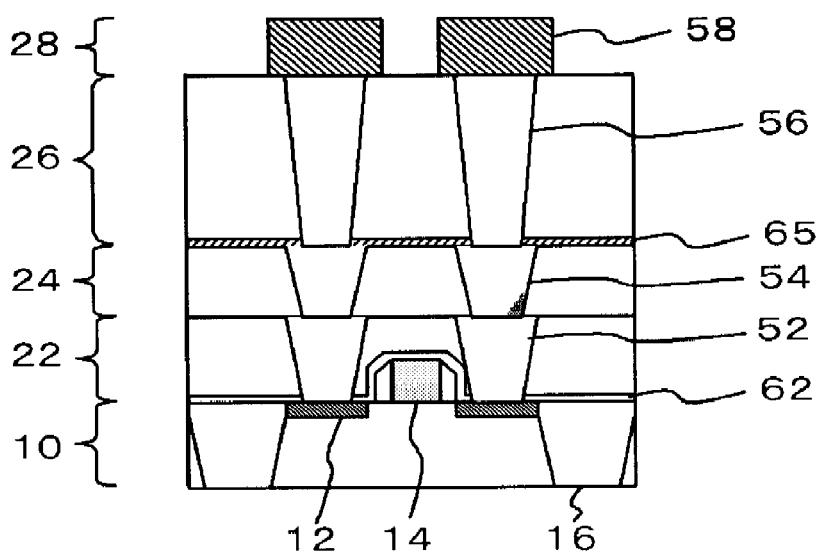

FIG. 9A to FIG. 9C, are diagrams, illustrating second embodiment of a semiconductor device according to the present invention. FIG. 9A to FIG. 9C correspond to FIG. 2A to FIG. 2C, respectively. In the present embodiment, the structure of the seal ring 30 is different from that of the first embodiment. Other constitutions thereof are similar to that of first embodiment.

In the present embodiment, sections of the seal ring 30 located in the interlayer insulating films 22 and 24 discontinuously surround the region D1 for forming the electric circuit. This provides a configuration, in which portions of the seal ring 30 are spaced apart from the semiconductor substrate 10. On the contrary, sections thereof in the interlayer insulating films 26 and 28 continually surround the region D1 for forming the electric circuit.

Sections of the seal ring 30 located in the interlayer insulating film 22 are configured of a plurality of column-shaped electroconducting plugs 32 that are provided to be spaced apart from one to others. These electroconducting plugs 32 are arranged over the substantially whole of the periphery of the region D1 for forming the electric circuit. Each of the electroconducting plugs 32 are coupled to the diffusion layer 12. The geometry of each of the electroconducting plugs 32 is identical to the geometry of contact plug 42 or 52 in plan view, and more specifically, circular. In addition, the dimension of each of the electroconducting plugs 32 is substantially equivalent to the dimension of contact plug 42 or 52. The electroconducting plugs 32 are formed simultaneously with forming the contact plugs 42 and 52. Similarly, sections of the seal ring 30 located in the interlayer insulating film 24 are also configured of a plurality of column-shaped electroconducting plugs 34 that are provided to be spaced apart from one to others. The electroconducting plugs 34 are formed simultaneously with forming the contact plugs 44 and 54. As described above, the seal ring 30 of the present embodiment includes the column-shaped electroconducting plugs 32 and 34 and the trench-shaped electroconducting plug 36 formed above the plug 34.

In the present embodiment, a portion of the seal ring 30 is spaced apart from the semiconductor substrate 10. More specifically, a section of lowermost layer of the seal ring 30 (electroconducting plug 32) discontinuously surrounds the region D1 for forming the electric circuit. This allows reducing the difference in the area of the openings between the opening for the electroconducting plug 32 and the opening for the contact plug 42 or 52. Therefore, the difference in the etch rates in the case of forming both openings by an etch process can also be reduced. Therefore, a damage brought to the diffusion layer 12 located under the contact plugs 42 and 52 due to the over-etching can be reduced, thereby reducing a deterioration in the data-storing ability of the DRAM 40.

In particular, in the present embodiment, the electroconducting plug 32 has the same geometry and the same dimension as the contact plugs 42 and 52 have. Thus, the above-described difference in the etch rates can be further reduced. Other advantageous effects of the present embodiment are similar to that in first embodiment.

Figure 10:
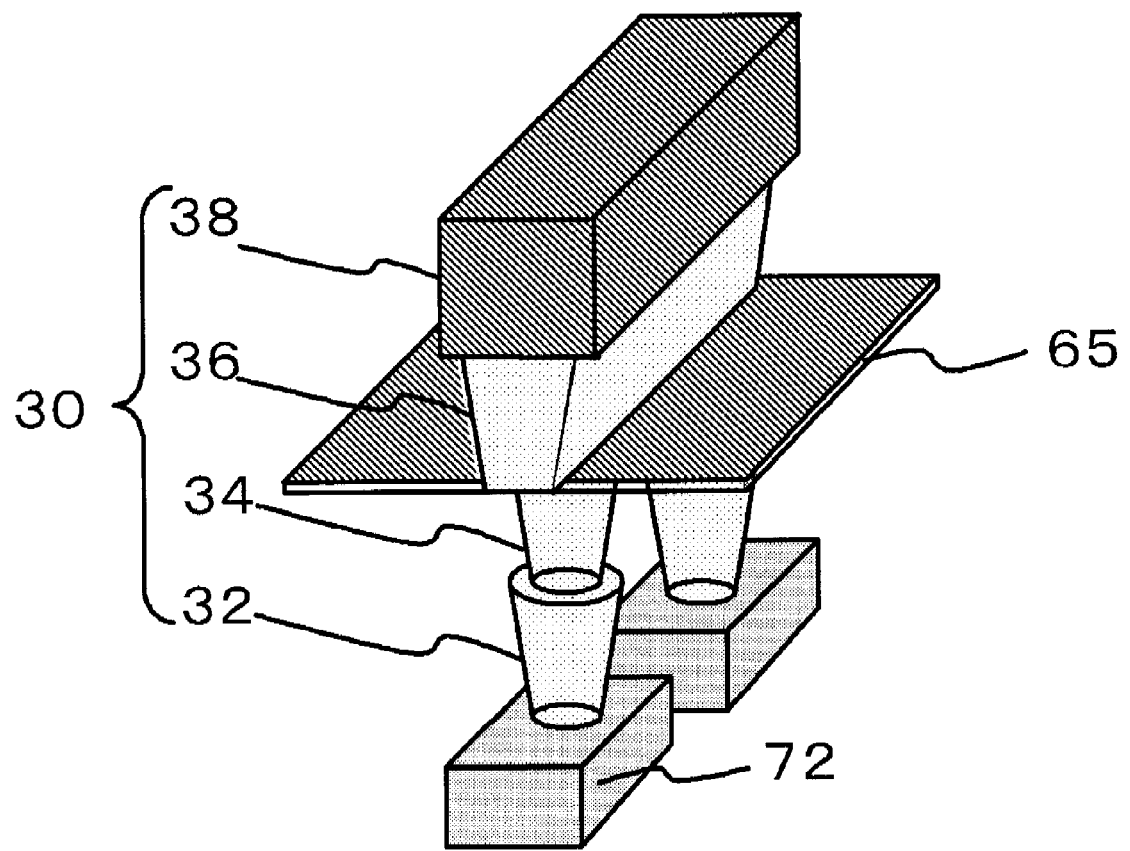
FIG. 10 is a schematic perspective view of a modified embodiment of a semiconductor device according to second embodiment of the present invention.

While the exemplary implementation, in which the electroconducting plug 32 is provided directly on the semiconductor substrate 10 (above the diffusion layer 12), is illustrated in the present embodiment, an electrically conducting film 72 may be interposed between the electroconducting plug 32 and the semiconductor substrate 10, as shown in FIG. 10. The electrically conducting film 72 is composed of the material, which is the same as the material (polysilicon, for example) composing the gate electrode 14 in the region D1 for forming the electric circuit, and is formed simultaneously with forming the gate electrode 14.

Figure 11:
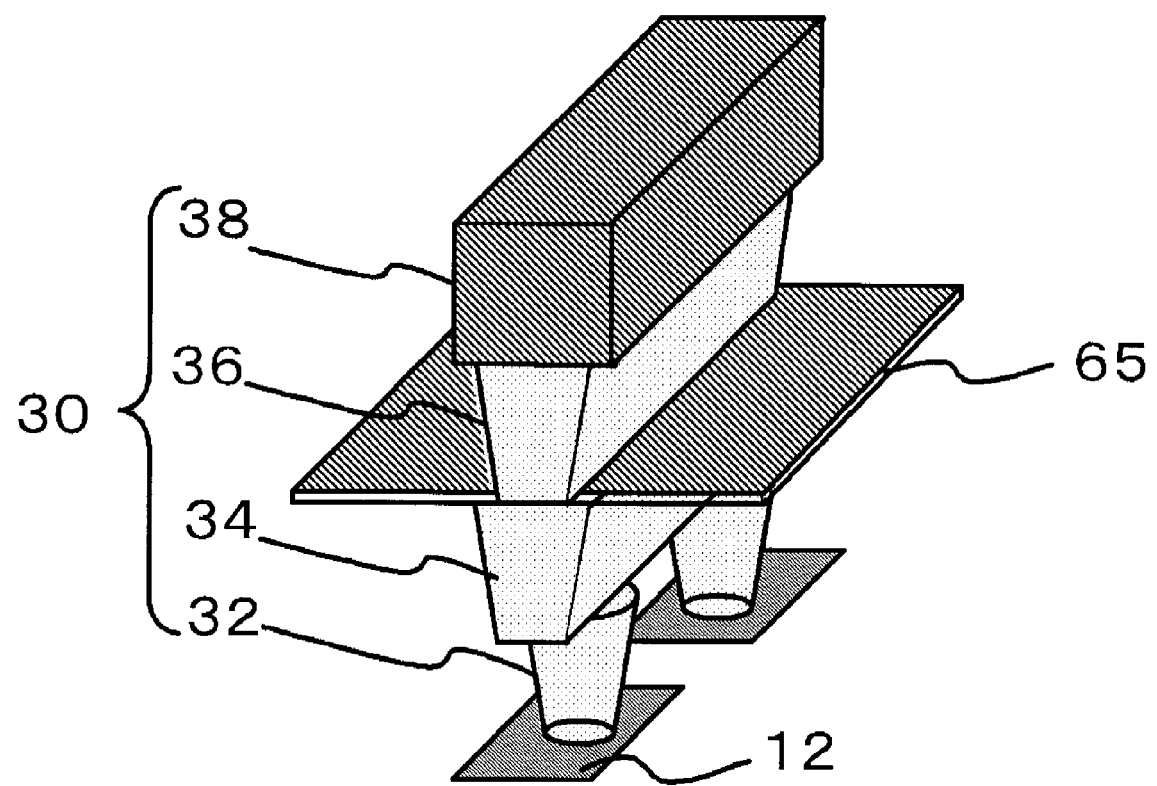
FIG. 11 is a schematic perspective view of the modified embodiment of the semiconductor device according to second embodiment of the present invention.
Figure 12:
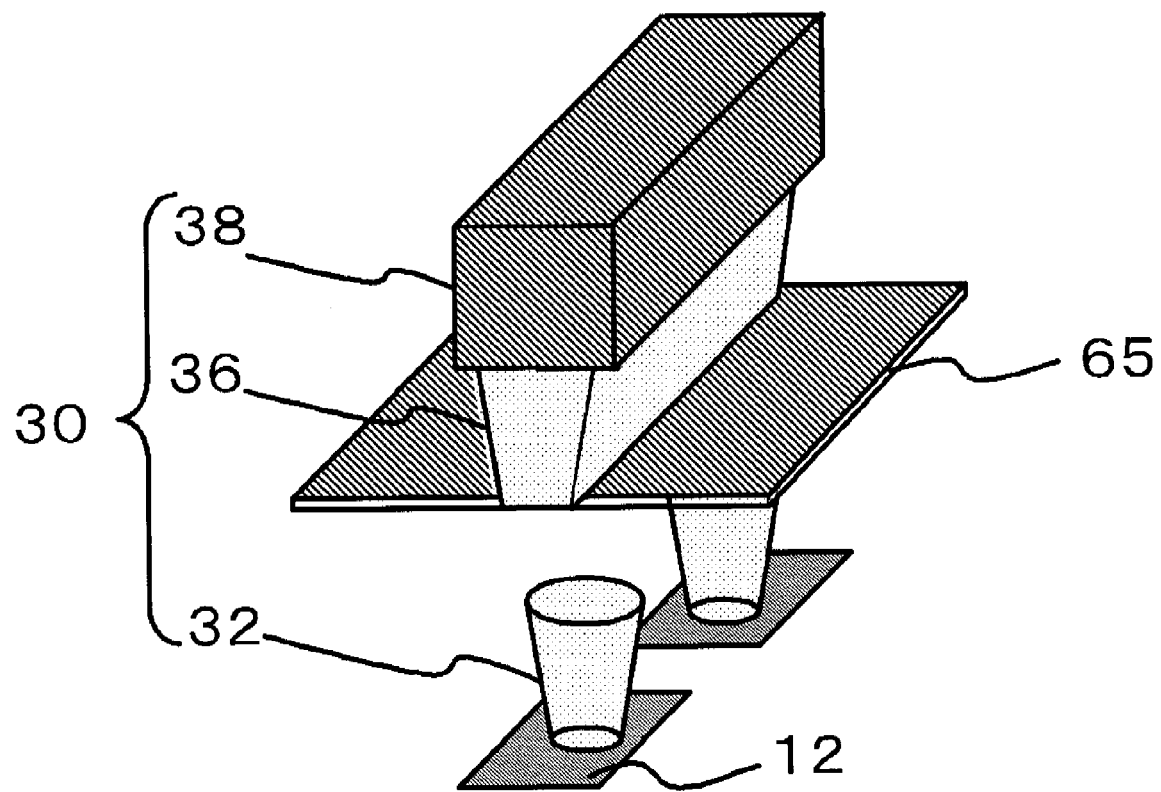
FIG. 12 is a schematic perspective view of the modified embodiment of the semiconductor device according to second embodiment of the present invention.

While the exemplary implementation of the semiconductor device provided with the column-shaped electroconducting plug 34 in the interlayer insulating film 24 of the seal ring is illustrated in the present embodiment, the electroconducting plug 34 may be a trench contact, as shown in FIG. 11. Alternatively, no electroconducting plug 34 may be provided, as shown in FIG. 12. In FIGS. 11 and 12, an electrically conducting film 72 (see FIG. 10) may be interposed between the electroconducting plug 32 and the semiconductor substrate 10.

Third Embodiment

Figure 13A:
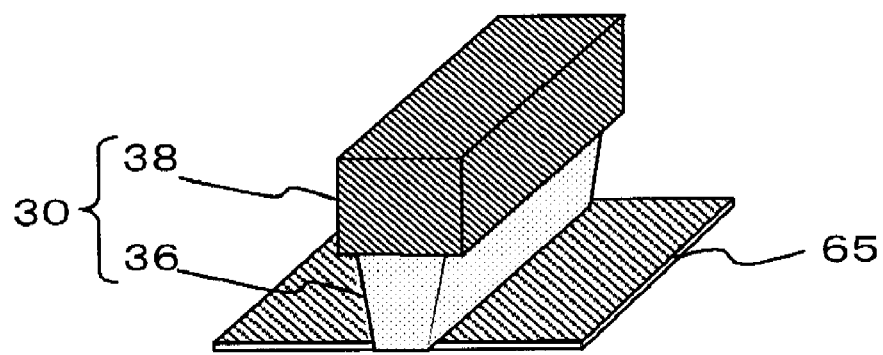
FIG. 13A is a perspective view, illustrating a seal ring of the semiconductor device according to third embodiment.
Figure 13B:
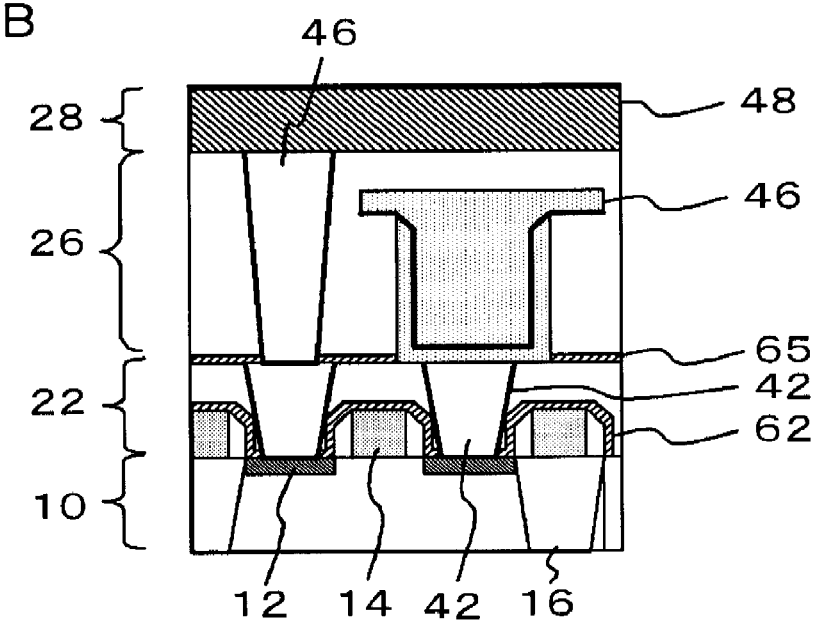
FIGS. 13B and 13C are cross-sectional views, illustrating a DRAM unit and a logic unit of the semiconductor device, respectively.
Figure 13C:
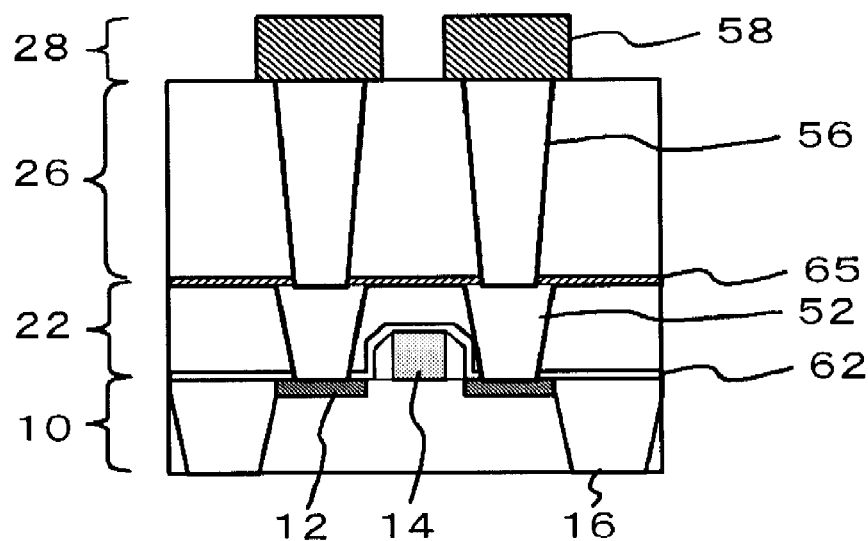

FIG. 13A to FIG. 13C, are diagrams, illustrating third embodiment of a semiconductor device according to the present invention. FIG. 13A to FIG. 13C correspond to FIG. 2A to FIG. 2C, respectively. In the present embodiment, as shown in FIG. 13B, a Cu interconnect 48 coupled to the diffusion layer 12 through the contact plugs 42 and 46 constitutes a bit line. With such constitution, no interlayer insulating film 24 including W interconnect 45 (see FIG. 2B) is provided. The DRAM 40 in such the present embodiment has a capacitor under bit-line (CUB) structure. The nitride film 65 is provided between the interlayer insulating film 22 and the interlayer insulating film 26. Other constitutions and advantageous effects of the present embodiment are similar to that of first embodiment.

Figure 14:
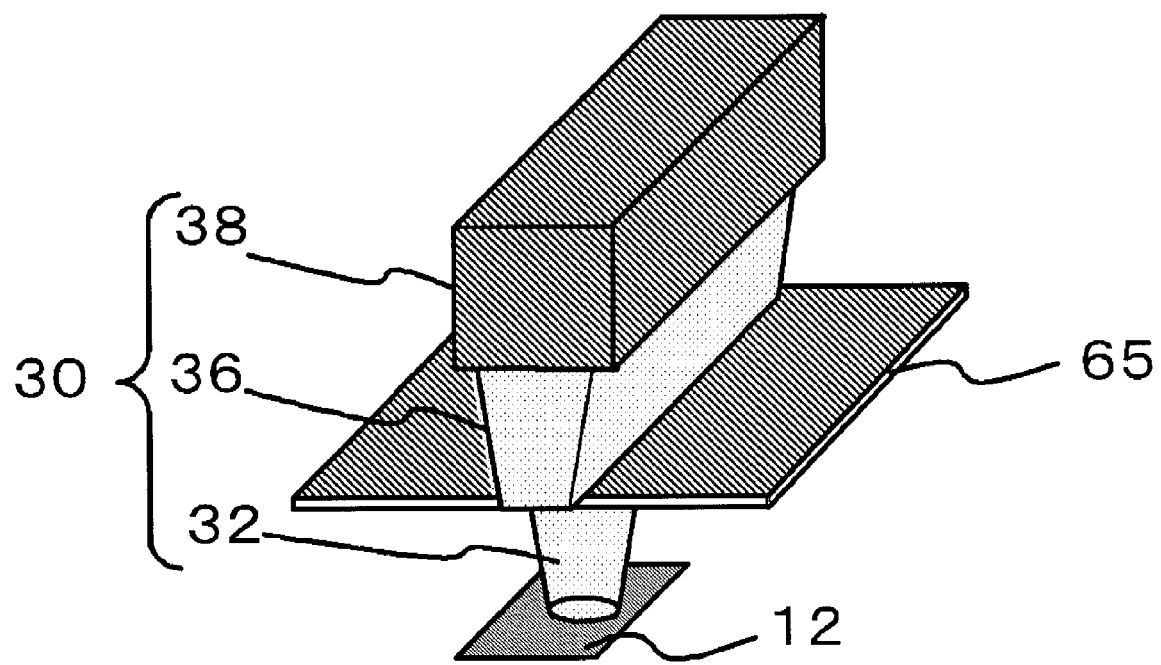
FIG. 14 is a schematic perspective view of a modified embodiment of a semiconductor device according to third embodiment of the present invention.
Figure 15:
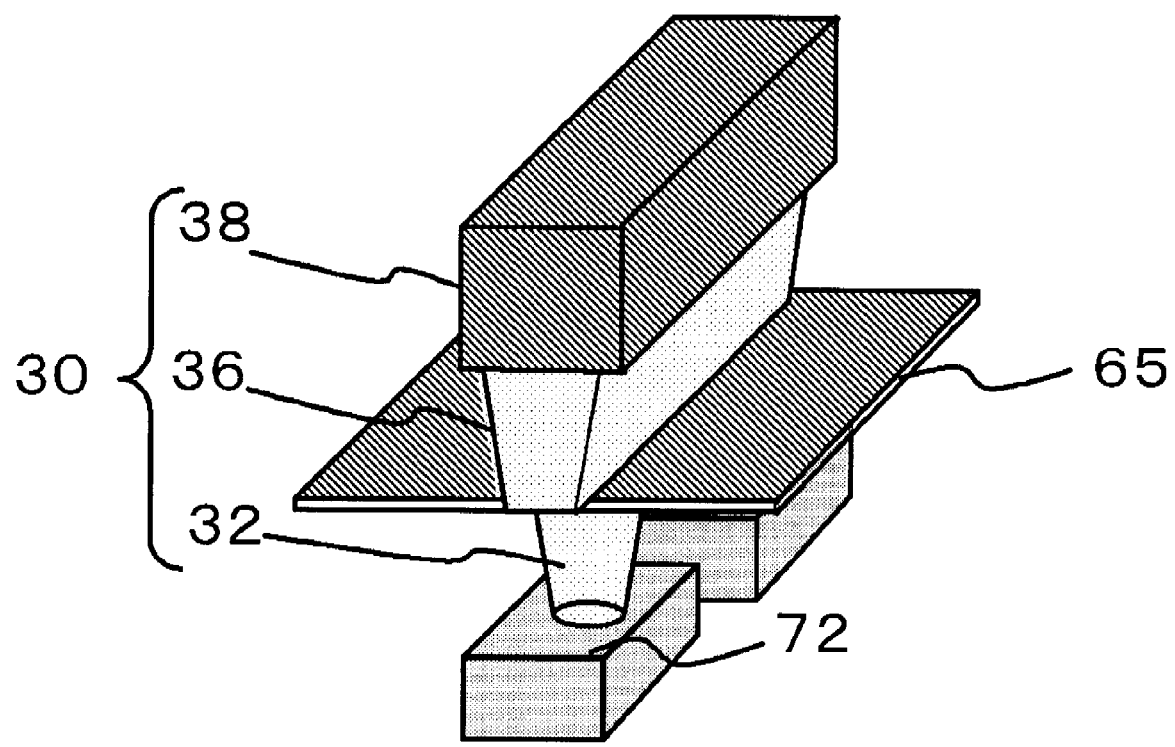
FIG. 15 is a schematic perspective view of the modified embodiment of the semiconductor device according to third embodiment of the present invention.

In addition to above, in the present embodiment, as shown in FIG. 14 and FIG. 15, a section of the lowermost layer of the seal ring 30 may be composed of the column-shaped electroconducting plug 32. FIG. 14 illustrates a case that the electroconducting plug 32 is provided directly on semiconductor substrate 10, and FIG. 15 illustrates a case that the electroconducting plug 32 is provided through an electrically conducting film 72.

Fourth Embodiment

Figure 16A:
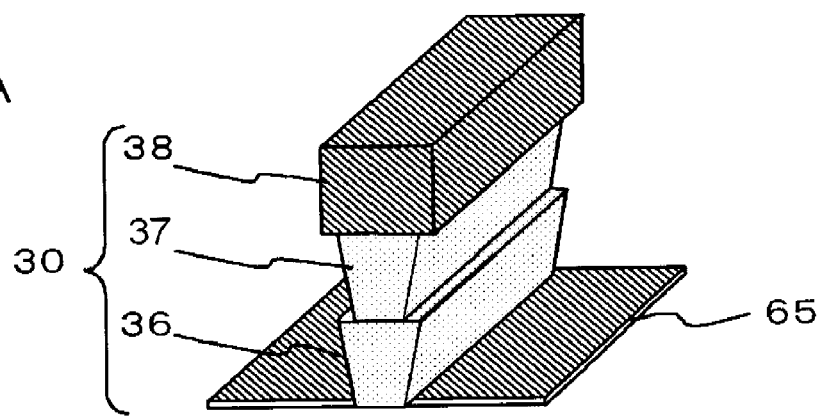
FIG. 16A is a perspective view, illustrating a seal ring of the semiconductor device according to fourth embodiment.
Figure 16B:
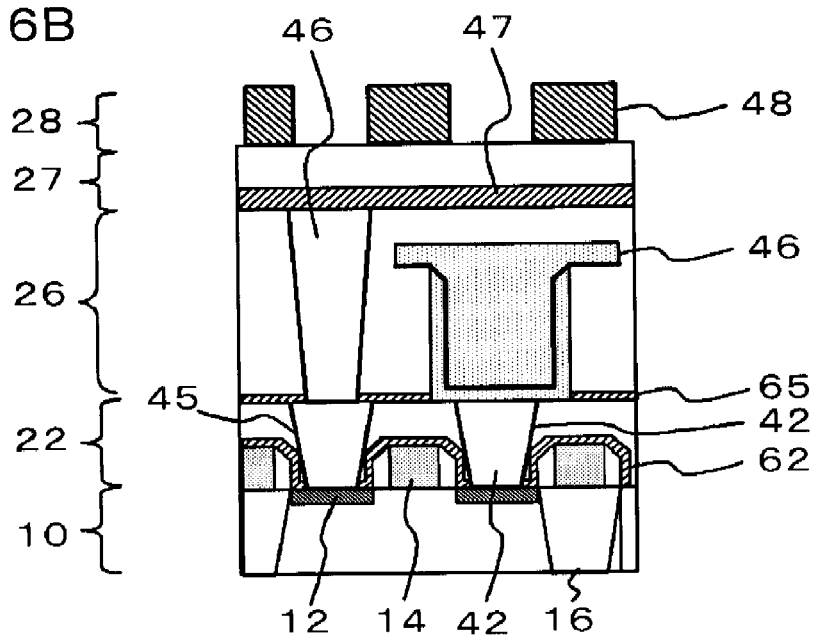
FIGS. 16B and 16C are cross-sectional views, illustrating a DRAM unit and a logic unit of the semiconductor device, respectively.
Figure 16C:
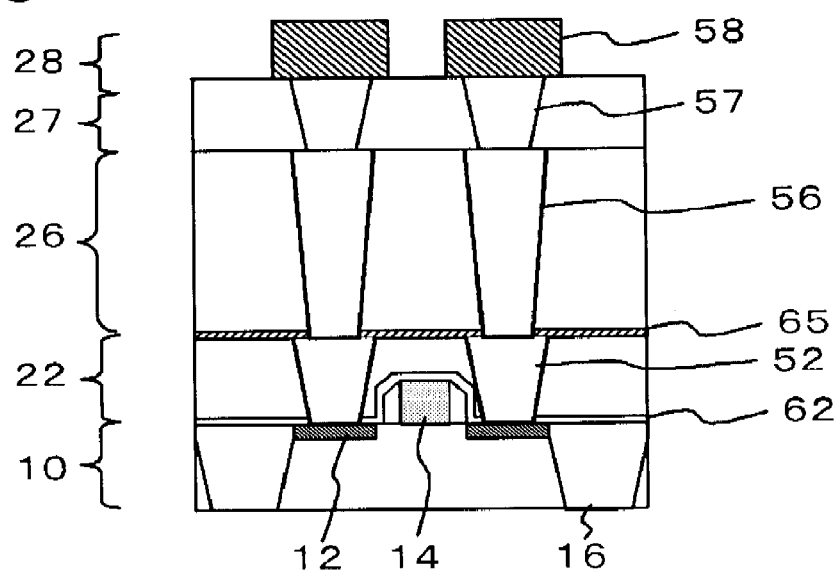

FIG. 16A to FIG. 16C, are diagrams, illustrating fourth embodiment of a semiconductor device according to the present invention. FIG. 16A to FIG. 16C correspond to FIG. 2A to FIG. 2C, respectively. The DRAM 40 has also a CUB structure in the present embodiment, similarly as in third embodiment. However, while the Cu interconnect 48 constitutes the bit line in third embodiment, W interconnect 47 provided in addition to the Cu interconnect 48 constitutes the bit line in the present embodiment. More specifically, as shown in FIG. 16B, the interlayer insulating film 27 is provided between the interlayer insulating film 26 and the interlayer insulating film 28, and the W interconnect 47 constituting the bit line is formed therein. The W interconnect 47 is coupled to the diffusion layer 12 through the contact plugs 42 and 46.

With such constitution, as shown in FIG. 16A, a trench-shaped electroconducting plug 37 formed in interlayer insulating film 27, together with electroconducting plug 36 and the Cu interconnect 38, constitutes the seal ring 30. In addition, in the logic circuit, as shown in FIG. 16C, the contact plug 57 formed in the interlayer insulating film 27, together with the contact plug 52 and 56, constitutes the stack contact. Other constitutions and advantageous effects of the present embodiment are similar to that of third embodiment.

Figure 17:
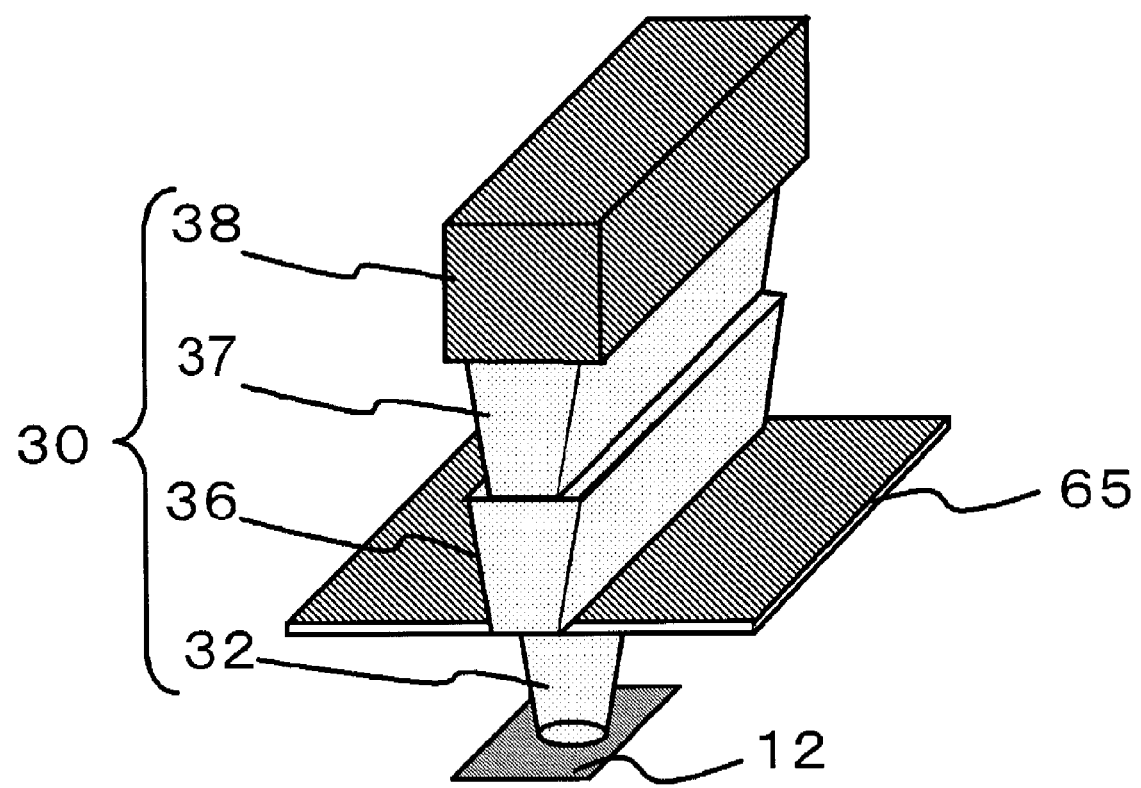
FIG. 17 is a schematic perspective view of a modified embodiment of a semiconductor device according to fourth embodiment of the present invention.
Figure 18:
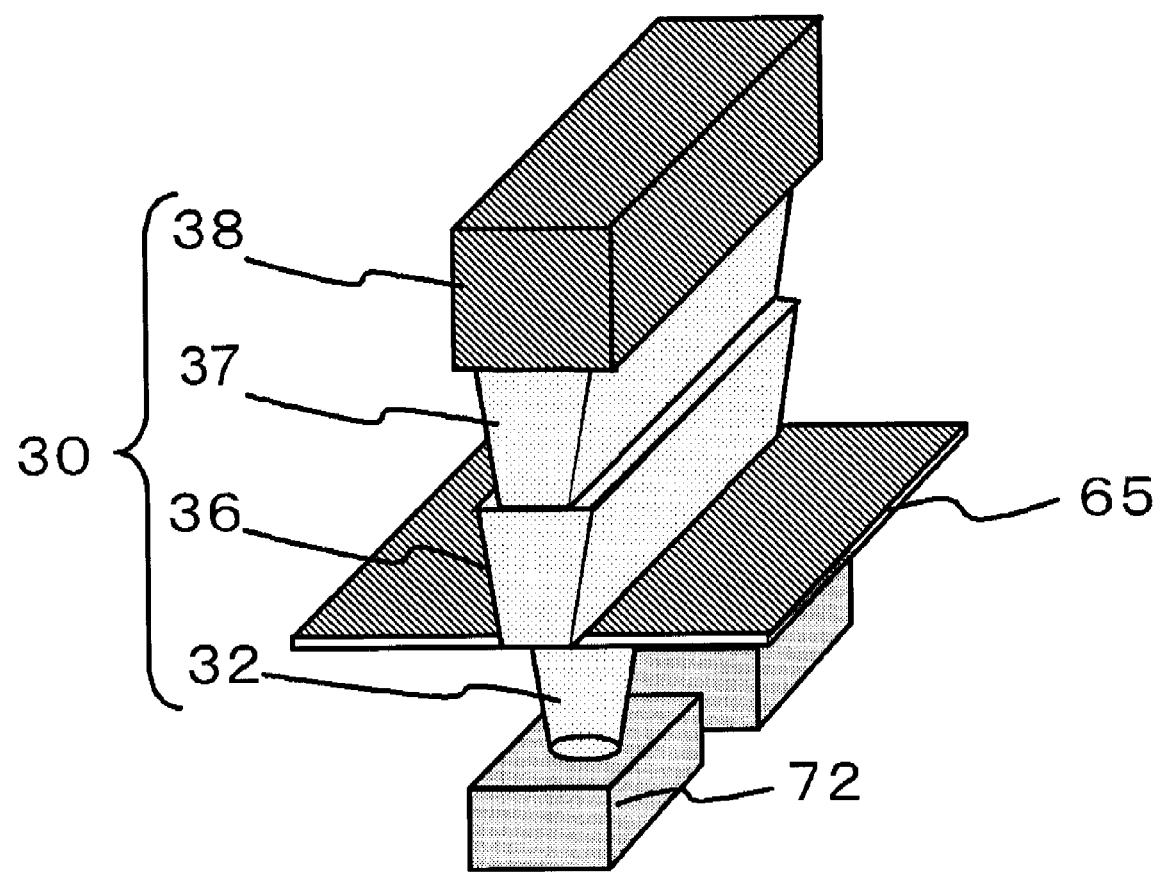
FIG. 18 is a schematic perspective view of the modified embodiment of the semiconductor device according to fourth embodiment of the present invention.
Figure 19A:
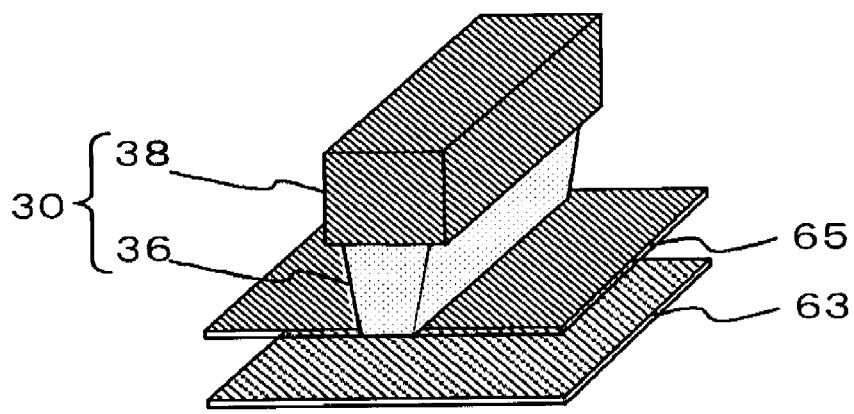
FIG. 19A is a perspective view, illustrating a seal ring of the semiconductor device according to a modified embodiment.
Figure 19B:
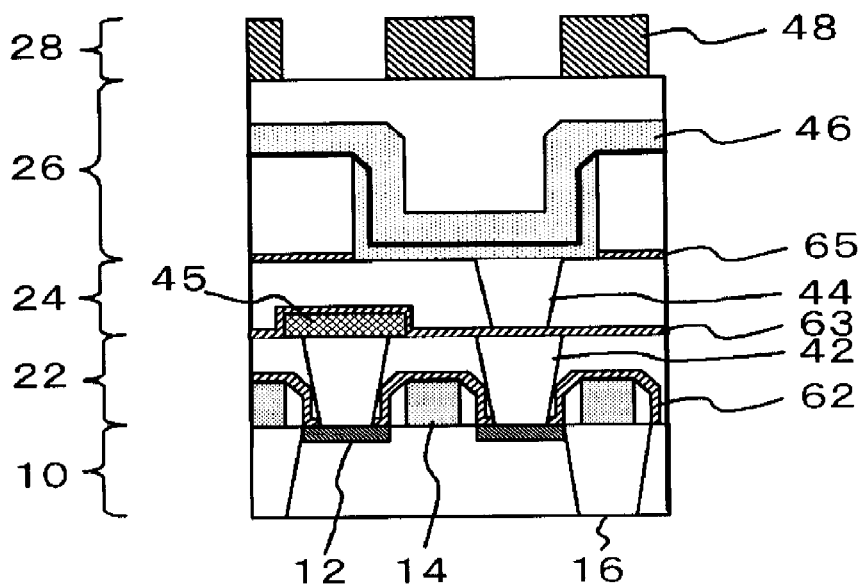
FIGS. 19B and 19C are cross-sectional views, illustrating a DRAM unit and a logic unit of the semiconductor device, respectively.
Figure 19C:
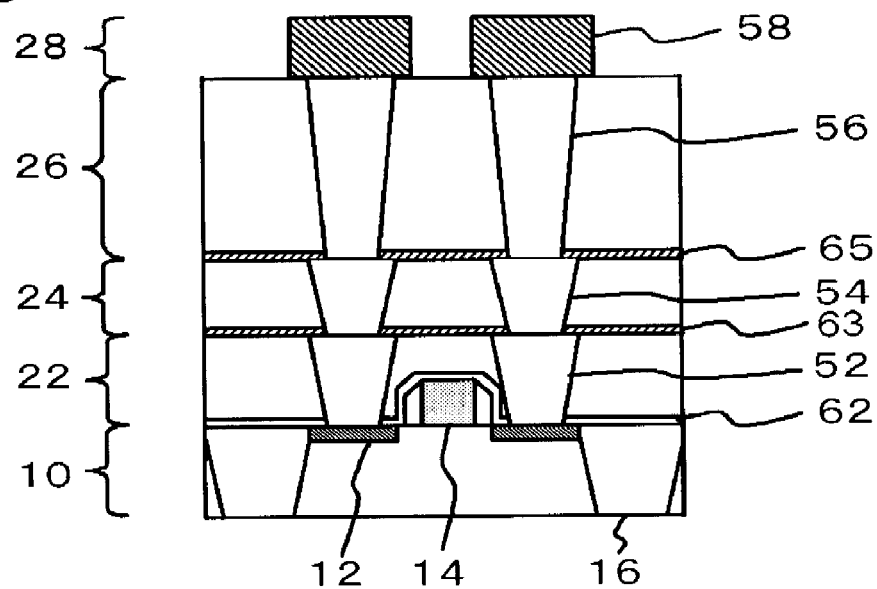
Figure 20A:
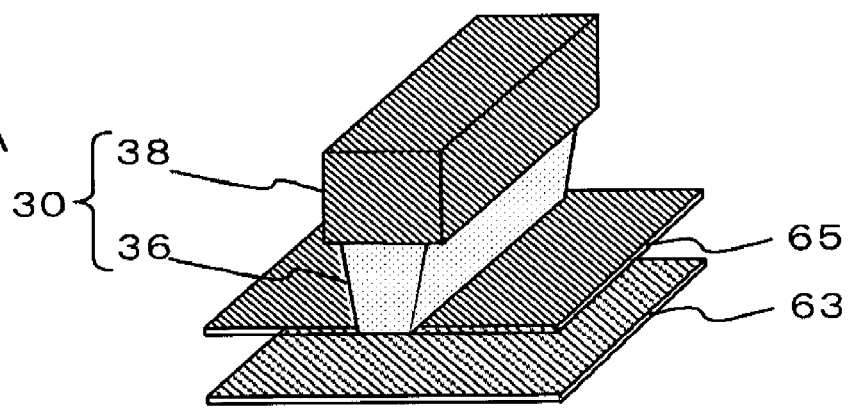
FIG. 20A is a perspective view, illustrating a seal ring of the semiconductor device according to a modified embodiment.
Figure 20B:
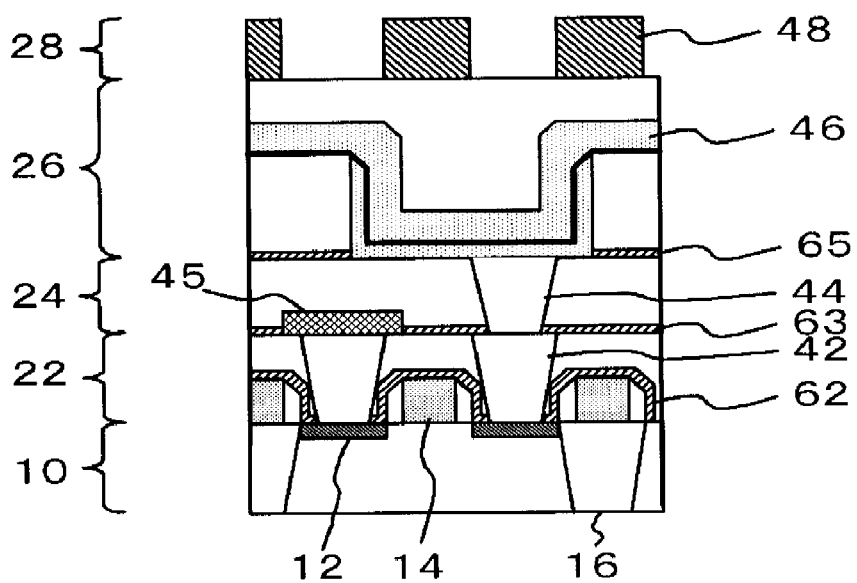
FIGS. 20B and 20C are cross-sectional views, illustrating a DRAM unit and a logic unit of the semiconductor device, respectively.
Figure 20C:
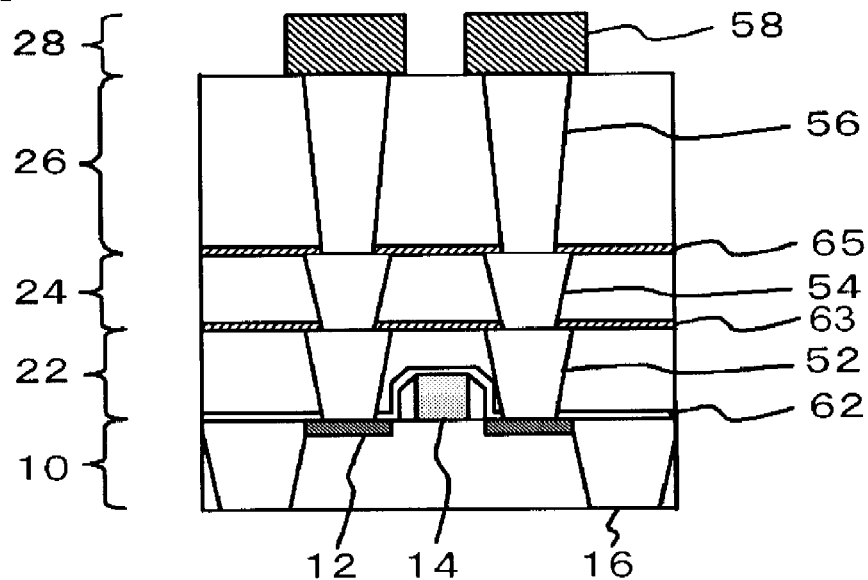

In addition to above, in the present embodiment, as shown in FIG. 17 and FIG. 18, a section of the lowermost layer of the seal ring 30 may be composed of the column-shaped electroconducting plug 32. FIG. 17 illustrates a case that the electroconducting plug 32 is provided directly on semiconductor substrate 10, and FIG. 18 illustrates a case that the electroconducting plug 32 is provided through an electrically conducting film 72.

It is intended that the semiconductor devices and the methods for manufacturing thereof according to the present invention are not limited to the configurations illustrated in the above-described embodiments, and thus various modifications thereof are also available. For example, while the exemplary implementations of the semiconductor device provided with the nitride film on the lower surface of the interlayer insulating film 26 have been illustrated in the above-described embodiments, such nitride film may alternatively be disposed on the upper surface of the interlayer insulating film 22. This allows more effectively preventing water from entering the inside of the region D1 for forming the electric circuit.

An exemplary implementation of a device provided with nitride films provided on both of the lower surface of the interlayer insulating film 26 and the upper surface of the interlayer insulating film 22 in the structures shown in FIG. 2A to FIG. 2C are illustrated in FIG. 19A to FIG. 19C and FIG. 20A to FIG. 20C. A nitride film 63 is provided so as to contact with the upper surface of the interlayer insulating film 22. Typical material available for composing the nitride film 65 may include an SiON film, a SiCN film, a SiN film and the like. The nitride film 63 is provided on the W interconnect 45 in FIG. 19A to FIG. 19C, and is provided under the W interconnect 45 in FIG. 20A to FIG. 20C. Typical material available for composing the nitride film 63 may include an SiON film, a SiCN film, a SiN film and the like.

In addition, while the exemplary implementations of the embedded DRAM have been illustrated in the above-described embodiments, an ordinary DRAM may alternatively be formed in the region D1 for forming the electric circuit. In other words, no logic circuit is required to be provided in the region D1 for forming the electric circuit.

It is apparent that the present invention is not limited to the above embodiment, and may be modified and changed without departing from the scope and spirit of the invention.

What is claimed is:

1. A semiconductor device having a region for forming an electric circuit, the region including a dynamic random access memory (DRAM) and peripheral circuits of the DRAM, comprising:

a semiconductor substrate;

an interlayer insulating film provided on said semiconductor substrate; and a guard ring, provided in said interlayer insulating film, and surrounding said region for forming the electric circuit, wherein a section of said guard ring discontinuously surrounds said region for forming the electric circuit along a periphery of said region.

2. The semiconductor device as set forth in claim 1, wherein said interlayer insulating film includes a first interlayer insulating film provided on said semiconductor substrate and a second interlayer insulating film provided in a layer that is located at a higher level than that of said first interlayer insulating film.

3. The semiconductor device as set forth in claim 2, wherein, said guard ring is provided only in said second interlayer insulating film and is not provided in said first interlayer insulating film.

4. The semiconductor device as set forth in claim 2, wherein a section of said guard ring located within said first interlayer insulating film discontinuously surrounds said region for forming an electric circuit, and a section of said guard ring located within said second interlayer insulating film continuously surrounds said region for forming the electric circuit.

5. The semiconductor device as set forth in claim 4, wherein said section of said guard ring located within said first interlayer insulating film is composed of a plurality of electroconducting plugs, which are provided to be spaced apart from one to the other.

6. The semiconductor device as set forth in claim 5, wherein a geometry of said electroconducting plug in plan view is equivalent to a geometry of a contact plug in said region for forming the electric circuit.

7. The semiconductor device as set forth in claim 6, wherein said geometry is a circle.

8. The semiconductor device as set forth in claim 5, wherein a dimension of said electroconducting plug is substantially the same as a dimension of the contact plug in said region for forming the electric circuit.

9. The semiconductor device as set forth in claim 5, wherein an electrically conducting film composed of a material that is same as a material composing a gate electrode in said region for forming the electric circuit is interposed between said electroconducting plug and said semiconductor substrate.

10. The semiconductor device as set forth in claim 2, wherein a capacitor constituting a cell of said DRAM is provided in said second interlayer insulating film.

11. The semiconductor device as set forth in claim 2, further comprising a nitride film, which is provided so as to contact with a lower surface of said second interlayer insulating film.

12. The semiconductor device as set forth in claim 2, further comprising a nitride film, which is provided so as to contact with an upper surface of said first interlayer insulating film.

13. The semiconductor device as set forth in claim 2, further comprising a nitride film, which is provided in said first interlayer insulating film, and covers a transistor formed in said region for forming the electric circuit.

14. A method for manufacturing a semiconductor device having a region for forming an electric circuit, the region including a dynamic random access memory (DRAM) and peripheral circuits of the DRAM, and a guard ring surrounding said region for forming the electric circuit, comprising:
   forming an interlayer insulating film on a semiconductor substrate; and
   forming said guard ring in said interlayer insulating film so that a section of said guard ring discontinuously surrounds said region for forming the electric circuit along a periphery of said region.

15. The method as set forth in claim 14, wherein said forming of said interlayer insulating film comprises forming a first interlayer insulating film on said semiconductor substrate and a second interlayer insulating film in a layer that is located at a higher level than that of said first interlayer insulating film.

16. The method as set forth in claim 15, wherein said forming of said guard ring comprises forming a section of said guard ring within said first interlayer insulating film to discontinuously surround said region for forming the electric circuit, and forming a section of said guard ring within said second interlayer insulating film to continuously surround said region for forming the electric circuit.

\* \* \* \* \*